United States Patent
Yuan et al.

(10) Patent No.: US 10,130,009 B2
(45) Date of Patent: Nov. 13, 2018

(54) NATURAL CONVECTION COOLING FOR POWER ELECTRONICS SYSTEMS HAVING DISCRETE POWER DISSIPATION COMPONENTS

(71) Applicant: American Superconductor Corporation, Ayer, MA (US)

(72) Inventors: Jie Yuan, South Grafton, MA (US); Peter Hansen, Holden, MA (US); John Brubaker, Milwaukee, WI (US); Patrick Flannery, Madison, WI (US); Peter Winn, Shrewsbury, MA (US)

(73) Assignee: American Superconductor Corporation, Ayer, MA (US)

( * ) Notice: Subject to any disclaimer, the term of this patent is extended or adjusted under 35 U.S.C. 154(b) by 0 days.

(21) Appl. No.: 15/459,187

(22) Filed: Mar. 15, 2017

(65) Prior Publication Data
US 2018/0270987 A1    Sep. 20, 2018

(51) Int. Cl.
*H05K 7/20* (2006.01)
*F28D 21/00* (2006.01)
*H01F 27/12* (2006.01)

(52) U.S. Cl.
CPC ......... *H05K 7/20245* (2013.01); *H05K 7/209* (2013.01); *H05K 7/20236* (2013.01);
(Continued)

(58) Field of Classification Search
CPC ............ H05K 7/20236; H05K 7/20927; H01F 27/12–27/125; F28D 2021/0031
See application file for complete search history.

(56) References Cited

U.S. PATENT DOCUMENTS 1,500,837 A * 7/1924 Moody ................. H01F 27/002
                                                          137/316
1,526,771 A * 2/1925 Burnham ............. H01F 27/025
                                                          165/104.33
(Continued)

FOREIGN PATENT DOCUMENTS

CN    1738144 A    2/2006
EP    2416486 A1   2/2012
(Continued)

OTHER PUBLICATIONS

Cargill, Envirtemp™ FR3™ Fluid, Electrical Apparatus R2000, 2016, 8 pages.*
(Continued)

*Primary Examiner* — Robert J Hoffberg
(74) *Attorney, Agent, or Firm* — Verrill Dana, LLP; John W. Powell

(57) ABSTRACT

A power electronics based system using natural, convection cooling, includes an enclosure housing a plurality of discrete components distributed in a vertical direction from a bottom portion to a top portion of the enclosure and having a heat density weighted average center at a first height along the vertical direction. There is a heat exchanger adjacent to the enclosure, including an inlet port and an outlet port in fluid communication with the enclosure. The heat exchanger has a vertical cooling average center at a second height. There is a cooling fluid disposed in the enclosure and in the heat exchanger to cool the discrete components. The discrete components are positioned in the vertical direction in the enclosure such that the first height of the heat density weighted average center along the vertical direction is below the second height of the vertical cooling average center of the heat exchanger.

16 Claims, 5 Drawing Sheets

(52) U.S. Cl.
CPC . *H05K 7/20927* (2013.01); *F28D 2021/0031* (2013.01); *H01F 27/125* (2013.01)

(56) References Cited

U.S. PATENT DOCUMENTS

| | | | | |
|---|---|---|---|---|
| 1,731,867 A * | 10/1929 | Rice | | H01F 27/12 |
| | | | | 123/41.01 |
| 1,814,871 A * | 7/1931 | Unger | | H01F 27/12 |
| | | | | 165/104.33 |
| 1,841,083 A * | 1/1932 | Bounce | | H01F 27/12 |
| | | | | 165/104.33 |
| 1,851,048 A * | 3/1932 | Keath | | H01F 27/12 |
| | | | | 165/104.33 |
| 1,957,245 A * | 5/1934 | Burnham | | H01F 27/12 |
| | | | | 165/104.32 |
| 3,545,538 A * | 12/1970 | Wilson | | F28F 9/013 |
| | | | | 165/104.33 |
| 3,602,856 A * | 8/1971 | White | | H01F 27/12 |
| | | | | 165/104.19 |
| 3,867,982 A * | 2/1975 | White | | H01F 27/12 |
| | | | | 165/104.31 |
| 4,140,174 A | 2/1979 | Lingenfelter | | |
| 4,201,523 A * | 5/1980 | Olofsson | | F04B 39/0033 |
| | | | | 165/104.33 |
| 4,437,082 A * | 3/1984 | Walsh | | C10G 25/006 |
| | | | | 174/14 R |
| 4,535,386 A | 8/1985 | Frey, Jr. et al. | | |
| 4,570,043 A * | 2/1986 | Lloyd | | H01F 27/105 |
| | | | | 218/99 |
| 5,894,884 A * | 4/1999 | Durian | | H01F 27/025 |
| | | | | 165/104.33 |
| 6,016,007 A | 1/2000 | Sanger | | |
| 6,037,537 A * | 3/2000 | McShane | | C09K 5/10 |
| | | | | 174/17 LF |
| 6,050,329 A * | 4/2000 | Durian | | F28F 1/12 |
| | | | | 165/104.33 |
| 6,184,459 B1 * | 2/2001 | McShane | | C09K 5/10 |
| | | | | 174/17 LF |
| 6,352,655 B1 * | 3/2002 | McShane | | C09K 5/10 |
| | | | | 174/17 LF |
| 6,398,986 B1 * | 6/2002 | McShane | | C09K 5/10 |
| | | | | 174/17 LF |
| 6,613,250 B2 * | 9/2003 | McShane | | C09K 5/10 |
| | | | | 174/17 LF |
| 6,905,638 B2 * | 6/2005 | Corkran | | C09K 5/10 |
| | | | | 174/17 LF |
| 7,651,641 B2 * | 1/2010 | Corkran | | C09K 5/10 |
| | | | | 174/17 LF |
| 7,847,189 B2 * | 12/2010 | Findeisen | | H01H 9/0044 |
| | | | | 174/17 CT |
| 7,871,546 B2 * | 1/2011 | Corkran | | C09K 5/10 |
| | | | | 174/17 LF |
| 8,000,102 B2 * | 8/2011 | Johnston | | B03C 3/68 |
| | | | | 336/65 |
| 8,051,706 B2 * | 11/2011 | DiFoggio | | E21B 47/011 |
| | | | | 73/152.51 |
| 8,801,975 B2 * | 8/2014 | Rapp | | H01B 3/20 |
| | | | | 174/17 LF |
| 9,646,761 B2 * | 5/2017 | Lin | | H01F 27/33 |
| 9,795,067 B2 * | 10/2017 | Takezawa | | H02M 7/48 |
| 2001/0032718 A1 | 10/2001 | Sheerin | | |
| 2008/0101779 A1 * | 5/2008 | Wu | | F24H 3/004 |
| | | | | 392/346 |
| 2011/0205768 A1 | 8/2011 | Svensson | | |
| 2013/0107455 A1 | 5/2013 | Cottet | | |
| 2014/0097804 A1 | 4/2014 | Hasler | | |
| 2015/0003015 A1 | 1/2015 | Kulkarni | | |
| 2015/0055298 A1 | 2/2015 | You | | |
| 2016/0139578 A1 | 5/2016 | Hasler | | |
| 2017/0018915 A1 * | 1/2017 | Juillet | | H01R 13/5221 |
| 2017/0338024 A1 * | 11/2017 | Guentert | | H05K 7/20263 |
| 2018/0114626 A1 * | 4/2018 | Bachinger | | H01F 27/12 |

FOREIGN PATENT DOCUMENTS

| | | |
|---|---|---|
| EP | 2825008 A1 | 1/2015 |
| EP | 2988579 A1 | 2/2016 |
| WO | WO-2010094338 A1 | 8/2010 |
| WO | WO-2012167834 A1 | 12/2012 |

OTHER PUBLICATIONS

Susa, Dejan, "Dynamic Thermal Modelling of Power Thransormers", Doctorial Dissertation, Helsinki University of Technology, Espoo, Findland, 2005.*

Warzoha et al., "Thermal Management of High Density Power Electronics Modules Using Dielectric Mineral Oil with Applications in the Electric Utility Field for Smart Grid Protection", Oct. 28, 2011, retrieved from internet Nov. 9, 2016: http://thermalscienceapplication.asmedigalcollection.asme.orgn/article.aspx?articleid=1469842 (2 pages).

Pruente, John, Director of Engineering Technical Support at SPX Transformer Solutions, Inc., PowerPoint Presentation, "Transformer Loading & Thermal Design Considerations", 46th Annual UTA TSDOS Sep. 2013 (32 pages).

International Search Report with Written Opinion, dated Jun. 28, 2018, received in international patent application No. PCT/US2018/022541, 12 pages.

International Search Report with Written Opinion, dated Jul. 2, 2018, received in international patent application No. PCT/US2018/022566, 12 pages.

Sato T et al: "Cooling Effect by Gas Density of SF6 Gas Insulated Transformer", IEE Transactions on Power Apparatus and Systems, IEEE Inc. New York, US, vol. 101, No. 2, Jun. 1, 1982, 7 pages.

* cited by examiner

NATURAL CONVECTION COOLING FOR POWER ELECTRONICS SYSTEMS HAVING DISCRETE POWER DISSIPATION COMPONENTS

FIELD OF INVENTION

The present invention generally relates to natural convention cooling for power electronics systems and more specifically to power electronics systems having discrete power dissipation components.

BACKGROUND

All electronic devices and circuits generate heat and thus require thermal management to improve reliability and prevent premature failure. The amount of heat output is equal to the power input, if there are no other energy interactions. There are several techniques for cooling electronic devices, including various styles of heat sinks, thermoelectric coolers, forced air systems and fans, heat pipes, and others.

Typical power electronic products contain numerous discrete sources of heat (e.g. power semiconductor switches, capacitors, and inductors) non-uniformly distributed within an enclosure. As a result, more complex cooling methods using dielectric fluids pumped by cooling loops and/or cold-plate based solutions have been required. For example, U.S. Pat. No. 6,016,007, describes a power electronics cooling apparatus which utilizes a dielectric fluid pumped through a cold plate to cool the power electronic semiconductors. This type of solution adds significantly to the cost of the product and it decreases the overall reliability.

Simpler cooling solutions exist for passive devices such as transformers. In U.S. Patent Publication No. US 2001/0032718A1, entitled System and Method for Cooling Transformers, there is described, among other things, a common practice for cooling transformers by a passively driven cooling fluid through an external heat exchanger. Since transformers comprise large, uniformly distributed heat sources (i.e. the transformer coils), generating a passively driven cooling loop through an external heat exchanger is relatively straight-forward. However, such less complex, passive cooling systems in power electronic devices has yet to be realized.

SUMMARY

An object of this invention is to provide a passively driven cooling system using an external heat exchanger to cool power electronic devices having numerous discrete sources.

In one aspect, the invention features a power electronics based system using natural, convection cooling. The system includes an enclosure housing a plurality of discrete components, at least two of said components being power dissipation components, the discrete components being distributed in a vertical direction from a bottom portion to a top portion of the enclosure and having a heat density weighted average center at a first height along the vertical direction. There is a heat exchanger adjacent to and external of the enclosure, the heat exchanger including an inlet port in fluid communication with the enclosure and an outlet port in fluid communication with the enclosure, the heat exchanger having a vertical cooling average center at a second height along the vertical direction. The system also includes a cooling fluid disposed in the enclosure and in the heat exchanger to cool the power dissipation components. The discrete components are positioned in the vertical direction in the enclosure such that the first height of the heat density weighted average center along the vertical direction is below the second height of the vertical cooling average center of the heat exchanger in order to sustain flow of the cooling fluid between the enclosure and the heat exchanger through natural convention. In other aspects of the invention one or more of the following features may be included. The discrete components may include one or more of a semiconductor switch, an inductor, a capacitor, control circuitry, gating circuitry, and communication circuitry. The discrete components may include a plurality of capacitors, a plurality of inductors, and a plurality of semiconductor switches, and wherein the plurality of capacitors are positioned at a height along the vertical direction which is greater than the height along the vertical direction of the plurality of inductors, and a plurality of semiconductor switches. The cooling fluid may include dielectric properties and it may comprise one of a mineral oil or a vegetable oil. The cooling fluid may comprise an FR3 vegetable oil. The inlet port of the heat exchanger may be in fluid communication with a first portion of the enclosure and the outlet port of the heat exchanger is in fluid communication with a second portion of the enclosure. The first portion of the enclosure may be located above the heat density weighted average center of the discrete components at the first height along the vertical direction and the second portion of the enclosure may be located below the heat density weighted average center of the discrete components at the first height along the vertical direction. A flow of the cooling fluid may be established from the enclosure to the heat exchanger through the inlet port of the heat exchanger and from the heat exchanger to the enclosure through the outlet port. An integration of the cooling fluid density multiplied by gravity along the path of the cooling fluid may be positive In yet another aspect, the invention features a method of cooling a power electronics based system using natural, convection cooling. The method comprises disposing in an enclosure housing a plurality of discrete components, at least two of said components being power dissipation components, the discrete components being distributed in a vertical direction from a bottom portion to a top portion of the enclosure and having a heat density weighted average center at a first height along the vertical direction. The method also includes disposing a heat exchanger adjacent to and external of the enclosure, the heat exchanger including an inlet port in fluid communication with the enclosure and an outlet port in fluid communication with the enclosure, the heat exchanger having a vertical cooling center at a second height along the vertical direction. The method further includes providing a cooling fluid disposed in the enclosure and in the heat exchanger to cool the power dissipation components. The discrete components are positioned in the vertical direction in the enclosure such that the first height of the heat density weighted average center along the vertical direction is below the second height of the vertical cooling average center of the heat exchanger in order to sustain flow of the cooling fluid between the enclosure and the heat exchanger through natural convention. In further aspects of the invention one or more of the following features may be included. The discrete components may include one or more of a semiconductor switch, an inductor, a capacitor, control circuitry, gating circuitry, and communication circuitry. The discrete components may include a plurality of capacitors, a plurality of inductors, and a plurality of semiconductor switches, and wherein the method may include positioning the plurality of capacitors at a height along the vertical direction which is greater than the height along the vertical direction of the plurality of inductors, and a plurality of semiconductor switches. The cooling fluid may include dielectric properties and the cooling fluid may comprise one of a mineral oil or a vegetable oil. The cooling fluid may comprise an FR3 vegetable oil. The inlet port of the heat exchanger may be in fluid communication with a first portion of the enclosure and the outlet port of the heat exchanger may be in fluid communication with a second portion of the enclosure. The first portion of the enclosure may be located above the heat density weighted average center of the discrete components at the first height along the vertical direction and the second portion of the enclosure may be located below the heat density weighted average center of the discrete components at the first height along the vertical direction. A flow of the cooling fluid may be established from the enclosure to the heat exchanger through the inlet port of the heat exchanger and from the heat exchanger to the enclosure through the outlet port. An integration of the cooling fluid density multiplied by gravity along the path of the cooling fluid may be positive.

DETAILED DESCRIPTION

To assist understanding of the invention, a preferred embodiment will be described in detail below. The detailed description of the preferred embodiment of the invention will be directed to passive cooling for a STATCOM system. However, the passive cooling approach described herein may be readily extended to any power electronics based device, including, for example, converters, inverters, rectifiers among other types of devices.

The general purpose of the cooling system described herein is to enable effective cooling of the discrete components in power electronics systems, including semiconductor switches, magnetics, capacitors, and control, gating, and communication circuitry. Of these, semiconductor switches and magnetics are typically the main contributors of heat that is essential to remove in order to maintain operation of the power electronic system.

With this system, the power semiconductors, filter components, and other discrete components may be disposed in a housing and immersed in a dielectric fluid which is passively driven using natural convection through an internal cooling loop in the housing and through an external fluid to air heat exchanger connected to the housing. The cooling system is characterized by locating power semiconductors, key filter elements and other power dissipation components below a critical vertical distance from the base of the housing. This critical distance depends upon the cooling loop geometry and allows for successful passive cooling of the power semiconductors and filter elements. The electrical operation of the power electronics system is well understood in the art and will not be described in detail herein as it is beyond the scope of the invention. The focus herein is on passive cooling of discrete components in power electronic based systems.

Figure 1:
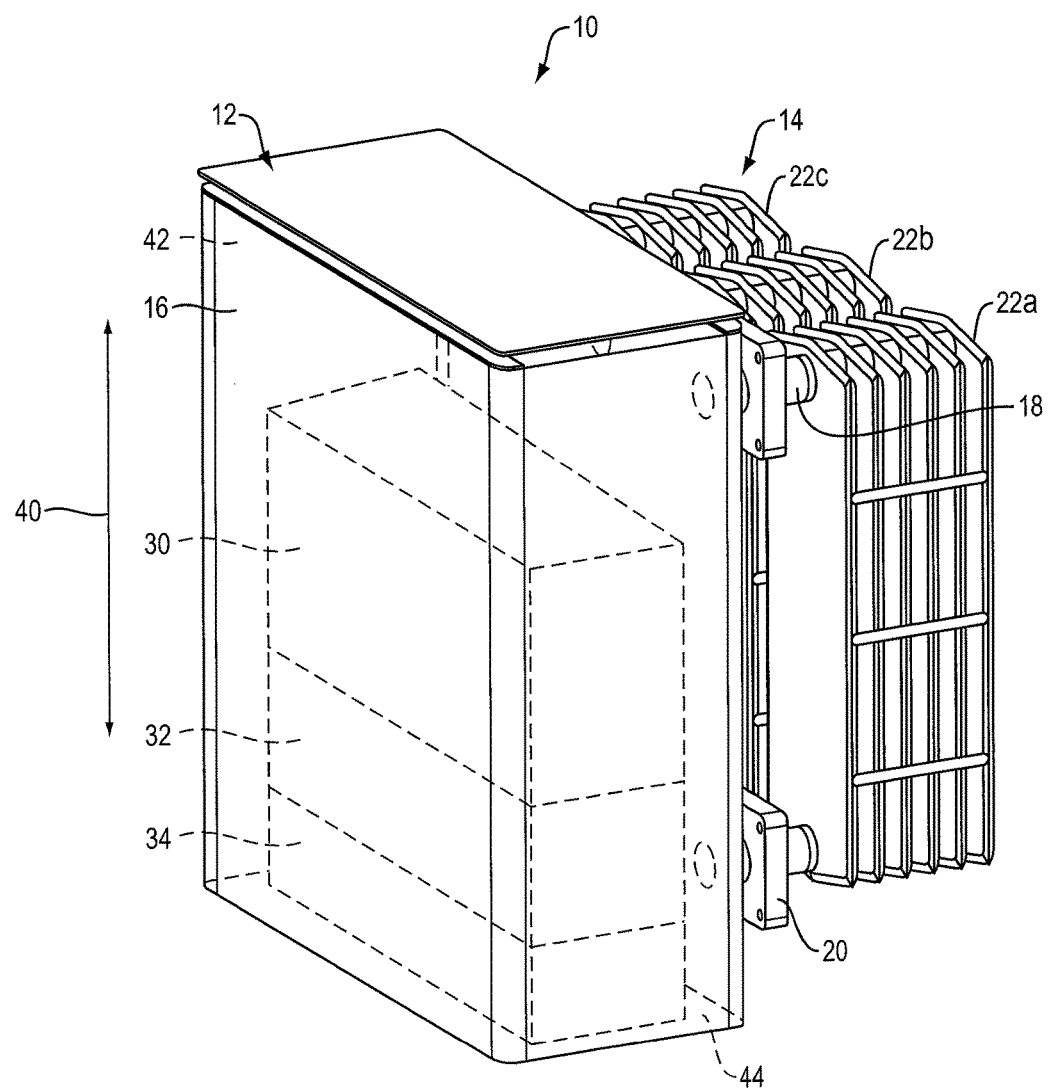
FIG. 1 is a side perspective view of a power electronics based system using natural, convection cooling according to this invention.

Power electronics based system 10, which in this example is a STATCOM system, is depicted in FIG. 1. System 10 includes an enclosure or housing 12 which is interconnected to a fluid (a liquid or gas, such as air) to air heat exchanger 14. Heat exchanger 14 is positioned adjacent to housing 12 and is interconnected to the internal space 16 of housing 12 through multiple ports, two of which are visible in this view. They are upper or inlet port 18 and lower or outlet port 20. Dielectric fluid contained in the internal space 16 as well as in the heat exchanger 14 flows through internal space 16 and into heat exchanger 14 through inlet ports (e.g. inlet port 18) and from heat exchanger 14 through outlet ports (e.g. outlet port 20). In this example there are three sets of inlet and outlet ports, one for each bank of radiator fins 22a, 22b, and 22c of heat exchanger 14; however, any suitable type/configuration of heat exchanger may be used. The radiator fins have a substantial surface area to allow for air cooling via conduction of the dielectric fluid as it passes therethrough.

Within internal space 16 of housing 12 are components which dissipate a significant amount of heat when they are operational and need to be cooled appropriately to avoid failure. The components in this example include a plurality of capacitors 30, semiconductor switching devices 32, e.g. IGBTs, and inductors 34 which are disposed in the internal space 16 in a stack along the vertical direction 40 of the housing 12. In this configuration the capacitors 30, which do not dissipate significant heat, are located on top of the stack at the highest position in vertical direction 40 closest to the top portion 42 of housing 12. The semiconductor switches 32 are next highest in the stack and inductors 34 are lowest in the stack and located in the bottom portion 44 of the housing 12. The semiconductor switches 32 and the inductors 34 dissipate a significant amount of heat compared to capacitors 30.

Figure 2B:
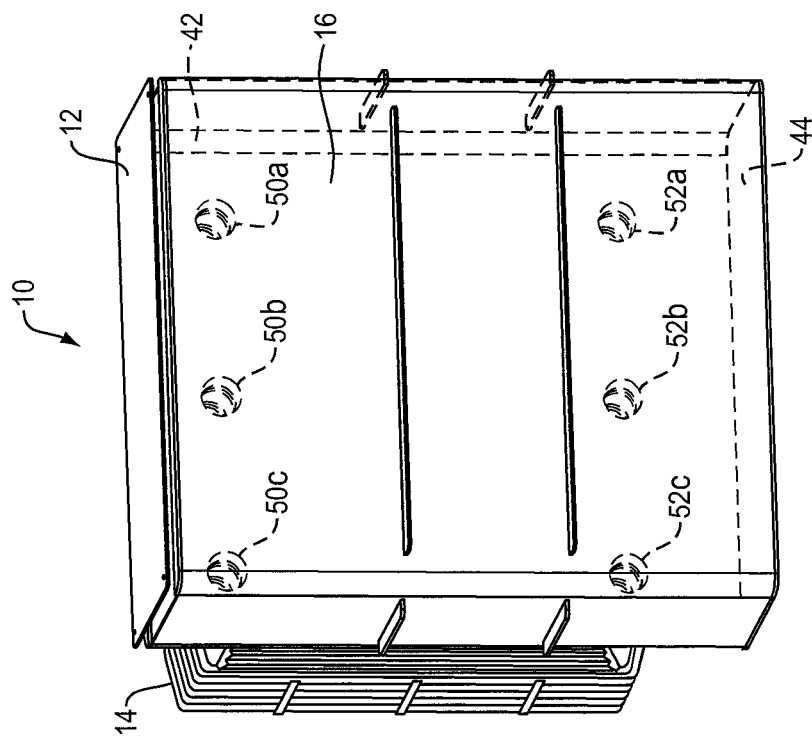
FIG. 2B is a front perspective of the power electronics based system of FIG. 1 with certain the discrete components removed from the enclosure.
Figure 2A:
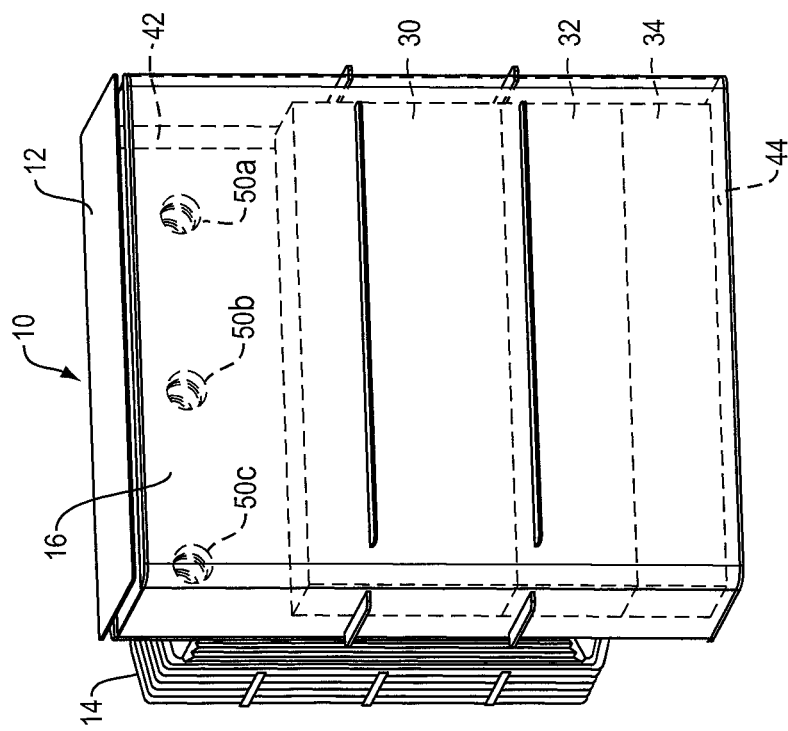
FIG. 2A is a front perspective of the power electronics based system of FIG. 1.

In FIGS. 2A and 2B, the interior of housing 12 is more clearly depicted. Apertures 50a-c in the back wall and the top portion 42 of housing 12 are interconnected to inlet ports, e.g. 18, allowing the cooling fluid to pass into the banks of radiator fins 22a, 22b, and 22c of heat exchanger 14. As visible in FIG. 2B, apertures 52a-c in the back wall and the bottom portion 44 of housing 12 are interconnected to outlet ports, e.g. 20, allowing the cooling fluid to pass from the banks of radiator fins 22a, 22b, and 22c of heat exchanger 14, returning to housing 12.

Referring again to FIGS. 1 and 2A, the main components which dissipate power and generate heat, namely, semiconductor switching devices 32 and inductors 34, can be arranged in any order in the internal space 16 in a stack along the vertical direction 40 of the housing 12, as long as the heat density weighted average center of such components is located below the cooling average center point of the external cooling loop. When this condition is met, passive cooling is driven by internal natural convection in the dielectric fluid and natural convection of the air surrounding the heat exchanger.

The "heat density weighted average center" is a unique point representing an aggregation of the discrete multiple heating components which can be used to determine an appropriate height within the enclosure relative to a cooling average center of the heat exchanger to achieve successful passive cooling. The heat density weighted average center is determined by the following formula:

$$y_{center} = \frac{\int_0^H y\, dq}{Q}$$

Where H is the total height of discrete heating components, q is linear heating density and Q is the total heat generation of the heating components.

Figure 3:
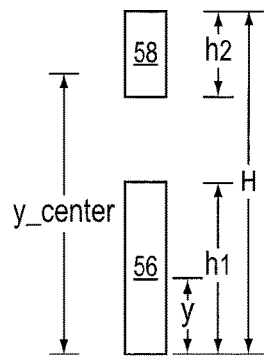
FIG. 3 schematic representation of the discrete components of power electronics based system of FIG. 1.
Figure 4:
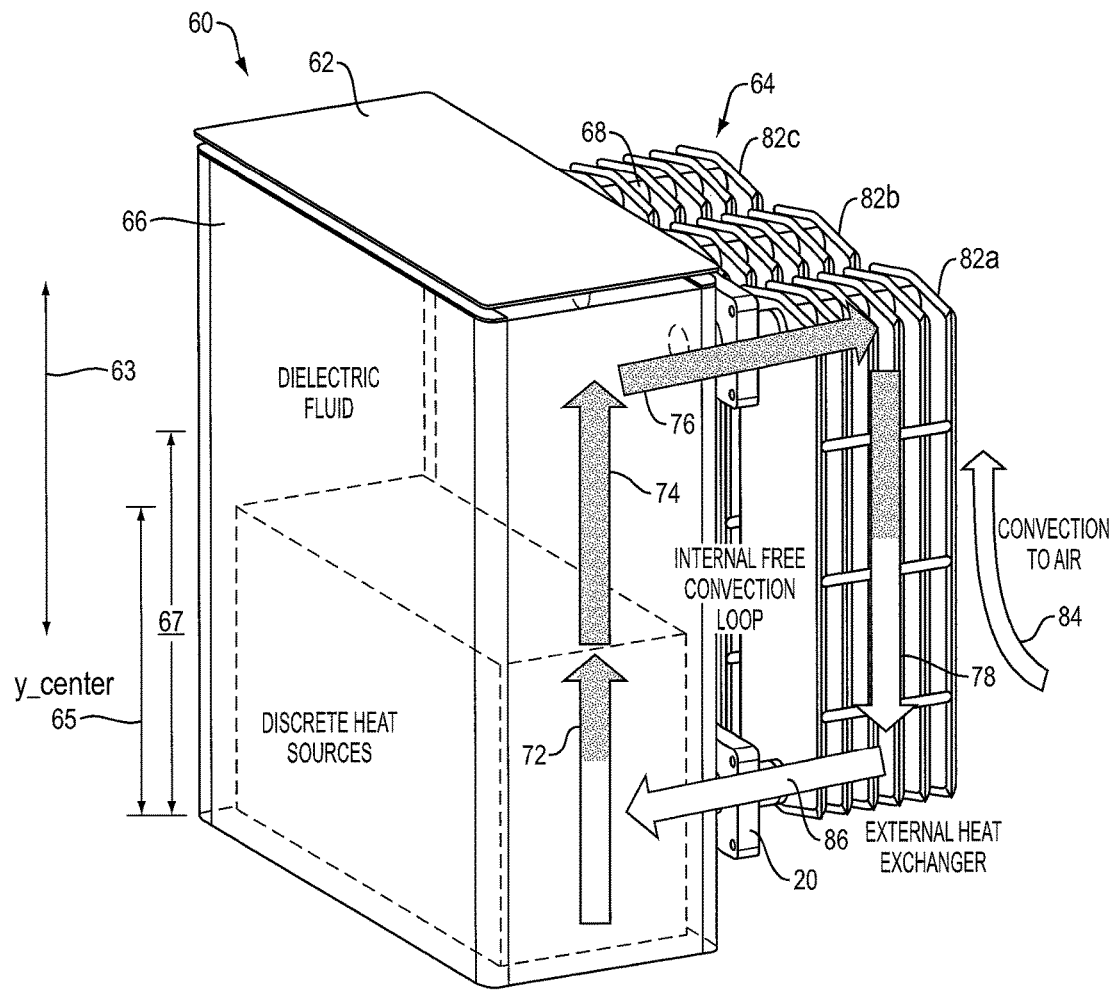
FIG. 4 is a side perspective view of a power electronics based system depicting the flow of dielectric fluid using natural, convention cooling according to this invention.

As an example of this calculation, in FIG. 3, there are shown a two discrete heating component 56 and 58 (e.g. semiconductor switches and inductors) with different heating rates $q_1$ and $q_2$. Heating component 56 is 8 in. in height (h1) and generates a total 8 W power uniformly along its height while heating component 58 is 4 in. in height (h2) and generates 400 W of power uniformly along its height. The total height, H, from the bottom of enclosure 62 to the top of heat dissipating component 58 is 16 in. The linear heating density for heating component 56 is calculated to be 1 W/in and for heating component 58 is 100 W/in. The "heat density weighted average center" (y_center) for this particular example may be determined by utilizing the formula above to be 13.8 in. The cooling average center of an air cooled heat exchanger can be similarly determined by the above formula, where q is the linear cooling density along the heat exchanger To demonstrate the passive or natural convection cooling according to this invention, power electronics based system 60 is shown in FIG. 4. System 60 includes multiple discrete sources of heat, such as power semiconductors and filter components as shown in FIGS. 1 and 2A. However, in this view the discrete components are not shown within enclosure or housing 62 to more clearly depict the natural convection cooling loop according to this invention. Heat exchanger 64 is positioned adjacent to housing 62 and is interconnected to the internal space 66 of housing 62 through multiple ports, e.g. upper or inlet port 68 and lower or outlet port 70. As shown by arrows 72 and 74 the dielectric fluid contained in the internal space 66 flows upward from outlet port 70, proximate the bottom of housing 62 to the top of housing 62. The dielectric fluid is at its coolest point as it exits the heat exchanger 68 and is increasingly warmed as it passes by the discrete components extracting heat from the discrete components.

Near the top of housing 62, the heated dielectric fluid flows into heat exchanger 68 via the inlet ports, e.g. inlet port 68, in the direction indicated by arrow 76 and flows downward through banks of radiator fins 82a, 82b, and 82c in the direction of arrow 78. As shown by arrow 84, due to the temperature difference between the heated fins and the ambient air temperature, convection causes an upward airflow across the radiator fins cooling the dielectric fluid as it passes there-through. At the bottom of heat exchanger 68 the cooled dielectric fluid flows through outlet ports (e.g. outlet port 70) in the direction of arrow 86 and back into housing 62.

The placement of power dissipating components along the vertical direction (shown by arrow 63) of housing 62 to produce heat density weighted average center at point 65 of such components below the cooling average center of air heat exchanger 68 at point 67 enables bulk free convection driven flow (i.e. no active pumping) of the dielectric fluid, which in this application may be high dielectric strength mineral oil, such as FR3 or a similar fluid. Failure to locate heat density weighted average center 65 of the power dissipating components below the cooling average center 67 of air heat exchanger 68 will render the free convection cooling loop effectively disabled.

The vertical location of the primary power dissipating components is particularly important in systems which use mineral oil or vegetable oil-based high dielectric strength oils as the cooling fluid. If the aggregate heat input by the heat sources represented by the heat density weighted average center is located above cooling average center of air heat exchanger, the viscosity of these oils will result in only the oil above the primary heat sources becoming hot and having reduced density. As a result, there will be insufficient total column density difference between the hot column of fluid in the housing and the cold column of fluid in the oil-to-air heat exchanger to drive the fluid flow around the internal loop without an active pumping source.

Figure 5A:
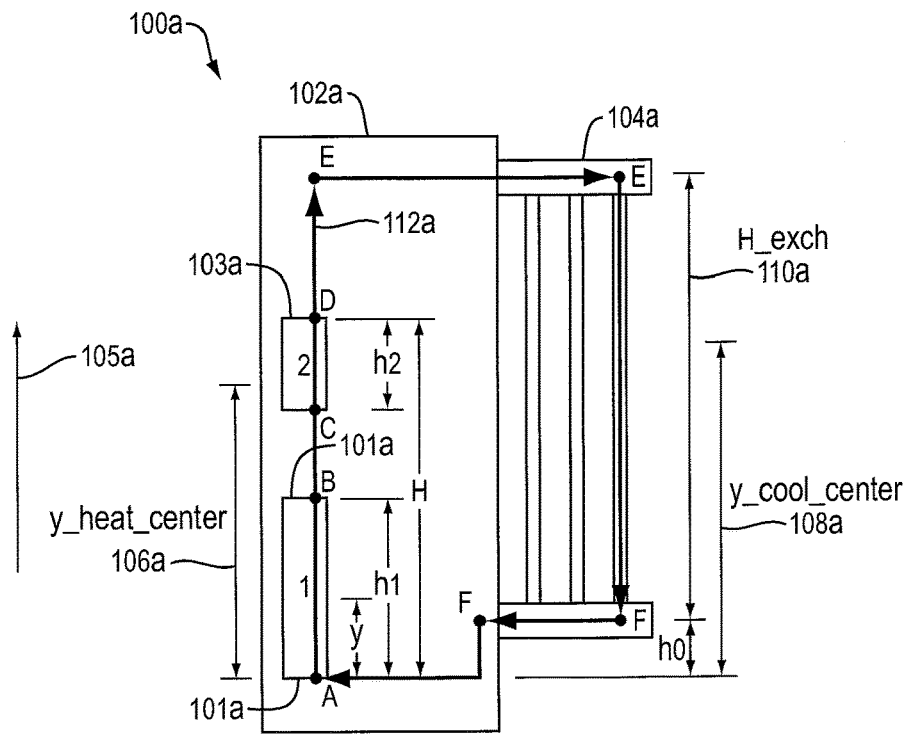
FIG. 5A is a cross-sectional view of power electronics based system with discrete component placement producing natural, convection cooling according to this invention.

As shown in FIG. 5A, a representative power electronic system 100a includes enclosure or housing 102a and heat exchanger 104a. The discrete power dissipation components 101a and 103a are arranged vertically in the direction indicated by arrow 105a within the housing 102a to produce a heat density weighted average center 106a which may be calculated as described above. The cooling average center 108a of heat exchanger 104a may also be calculated in the manner described above. Since the height 110a of the heat exchanger 104a is positioned near the top of enclosure 102a and the discrete components 101a and 103a are positioned relatively low in enclosure 102a, it places the cooling average center 108a at a position above the heat density weighted average center 106a of the discrete components in vertical direction 105a. Therefore, there will be sufficient total column density difference between the hot column of fluid in housing 102a and the cold column of fluid in the heat exchanger 104a to drive the fluid flow around the internal loop 112a without an active pumping source.

One way to achieve a relatively low heat density weighted average center 106a is to locate the discrete components having the highest power dissipation, thus heat generating capacity (i.e. power semiconductors and inductors) below the discrete components having the lowest power dissipation thus heat generating capacity (i.e. capacitors), as shown in FIGS. 1 and 2A. This is contrary to the typical arrangement of components in a power electronic system. For example, capacitors are usually located at the bottom of the stack, which is the coolest location in the enclosure as it is where the fluid is returned from the heat exchanger and it is at its coolest temperature. Manufacturer specifications require relatively low maximum heating of capacitors as compared to semiconductor switches and inductors. Capacitors may have maximum heat capability in the range of 85 degrees C. as compare to 105-120 degrees C. for semiconductor switches and inductors. With the current design, the capacitors could be located at the bottom of the stack, but in order to achieve a cooling average center of the heat exchanger at a position above the heat density weighted average center of the discrete components the enclosure height and the height/length of the heat exchanger would need to be increased significantly. Instead, the inventors were able to position the capacitors at the top of the stack, while providing adequate cooling for the capacitors and at the same time achieving natural convection cooling without having to increase the height of the enclosure.

Figure 5B:
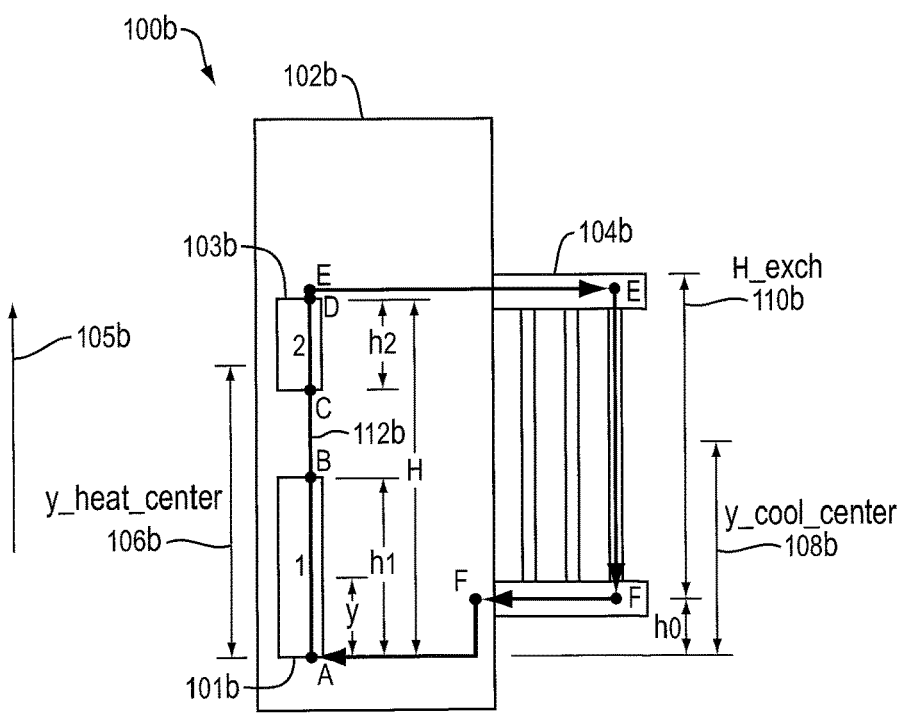
FIG. 5B is a cross-sectional view of power electronics based system with discrete component placement not producing natural, convection cooling according to this invention.

As shown in FIG. 5B, another representative power electronic system 100b includes housing 102b and heat exchanger 104b. The discrete power dissipation components 101b and 103b are arranged vertically in the direction indicated by arrow 105b within the housing 102b to produce a heat density weighted average center 106b which may be calculated as described above. The cooling average center 108b of heat exchanger 104b may also be calculated in the manner described above. In this example, in contrast to the example shown in FIG. 5A, the height 110b of the heat exchanger 104b is positioned further from the top of enclosure 102b resulting in the cooling average center 108b being positioned lower than the cooling average center 108a of FIG. 5A. The discrete components 101b and 103b have the same power dissipation characteristics, size and positioning along the vertical direction of the enclosures, but due to the low positioning of the heat exchanger 104b, the cooling average center 108b is at a position above the heat density weighted average center 106a of the discrete components along the vertical direction 105b. Therefore, there will be insufficient total column density difference between the hot column of fluid in housing 102b and the cold column of fluid in the heat exchanger 104b to drive the fluid flow around the internal loop 112b without an active pumping source.

Figure 6A:
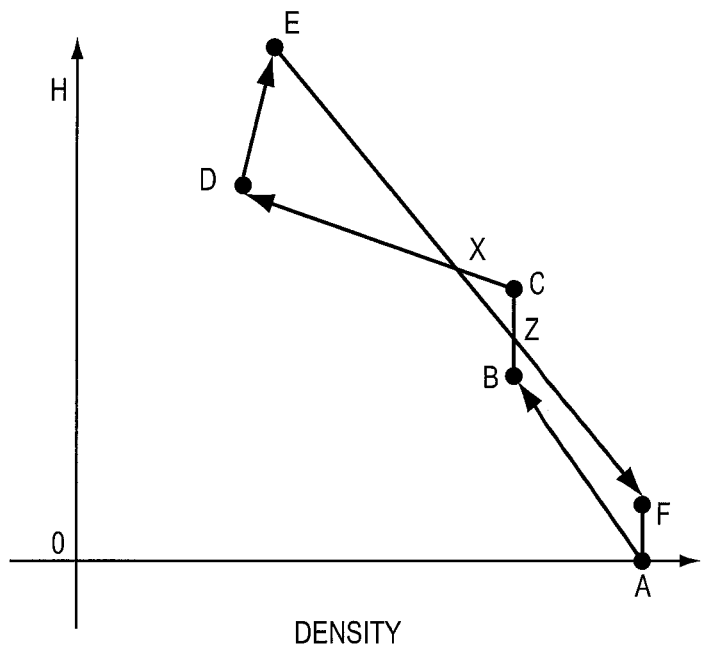
FIG. 6A depicts a plot of coolant density change in the vertical direction of the enclosure of power electronics based system of FIG. 5A.
Figure 6B:
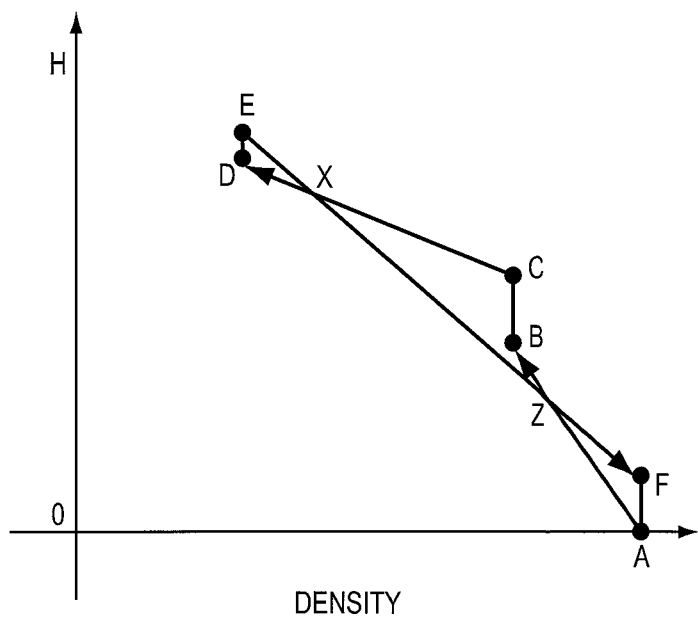
FIG. 6B depicts a plot of coolant density change in the vertical direction of the enclosure of power electronics based system of FIG. 5B.

The above two examples depicted in FIGS. 5A and 5B are analytically modeled in FIGS. 6A and 6B, respectively, which show the density change along the x-axis plotted against the height of the housings 102a and 102b. The natural convection is driven by the thermal expansion and subsequent change of density of the dielectric fluid by temperature.

In FIG. 6A it is shown that heat is applied between points A and D by the discrete components 101a and 103a. Due to the heat increase between points A and B and between points C and D, the density of the dielectric fluid decreases and thus physically rises in enclosure 102a. From points D to E some heat is removed from the dielectric fluid due to convection on the external surfaces of the application enclosure. This causes the density to increase slightly between points D and E. The majority of the heat is removed as the fluid passes through the heat exchanger 104a in the external cooling loop from points E to F. This causes the density to increase and the fluid to cool. Between points F and A, the cooled fluid returns to the enclosure 102a. The basic relationship between thermal driving force produced by heating component and pressure drop in the loop can be formulated as:

$$\oint \rho \vec{g} \vec{dl} = \Delta P_{internal} + \Delta P_{loop}$$

Where $\Delta P_{internal}$ is the pressure change within the enclosure and $\Delta P_{loop}$ is the pressure change in the heat exchanger and the addition of these pressure changes equals the integration of fluid density multiplied by gravity along the path of the enclosure and the heat exchanger. Since the total pressure drop of the loop is always positive, in order to maintain a passive flow in the external cooling loop, a net positive driving force must be maintained. As described above, this can be achieved by ensuring that the heat density weighted average center is below the cooling average center point of the external cooling loop. This is graphically depicted in FIG. 6A where area DEX plus ABZF is larger than area XCZ (i.e. net enclosed area is positive) thus net positive driving force is produced resulting in natural convection flow of the dielectric fluid around the cooling loop.

In FIG. 6B it is shown how heat is applied between points A and B, between points C and D by the discrete components, which points are also depicted in FIG. 5B. This is graphically depicted in FIG. 6B where area CXZB is larger than area DEX and AZF combined indicating a net negative driving force (i.e. net enclosed area is negative) resulting in no natural convection flow of the dielectric fluid around the cooling loop.

In the above described examples, only one external cooling loop (albeit with multiple inlet/outlet ports) is shown. However, in alternate configurations, there can be several parallel loops (each loop with several inlet/outlet ports and a heat exchanger) positioned at different heights in the vertical direction of the housing, as long as each loop adheres to the model described above where the vertical cooling center of the heat exchangers remain above the heat density weighted average center of the discrete components.

The invention is implemented and described for a power electric product with the main heat sources to be silicon-, GaN-, or SiC-based semiconductors and magnetics. However, the invention is more generally applicable to any power electronic product where the main source of heat is immersed in a dielectric.

In the examples, the power electronic components are shown immersed in a cooling fluid. However, the proposed means of enabling bulk fluid movement in a natural convection system may be employed where the cooling fluid is located in a separated channel and the power electronic components transmit thermal power to the fluid in this channel via conduction (i.e. heatsinks).

What is claimed is:

1. A power electronics based system using natural, convection cooling, comprising:
    an enclosure, housing a plurality of discrete electrical components being distributed in a vertical direction from a bottom portion to a top portion of the enclosure and having a heat density weighted average center at a first height along the vertical direction;
    a heat exchanger adjacent to and external of the enclosure, the heat exchanger including an inlet port in fluid communication with the enclosure and an outlet port in fluid communication with the enclosure, the heat exchanger having a vertical cooling average center at a second height along the vertical direction; and
    a cooling fluid disposed in the enclosure and in the heat exchanger to cool the discrete electrical components, the discrete electrical components immersed in the cooling fluid;
    wherein the discrete electrical components are positioned in the vertical direction in the enclosure such that the first height of the heat density weighted average center along the vertical direction is below the second height of the vertical cooling average center of the heat exchanger in order to sustain flow of the cooling fluid between the enclosure and the heat exchanger through natural convection; and
    wherein the discrete electrical components include a plurality of capacitors, a plurality of inductors, and a plurality of semiconductor switches, and wherein the plurality of capacitors are positioned at a height along the vertical direction which is greater than a height along the vertical direction of the plurality of inductors and the plurality of semiconductor switches.

2. The system of claim 1 wherein the cooling fluid includes dielectric properties.

3. The system of claim 2 wherein the cooling fluid comprises one of a mineral oil or a vegetable oil.

4. The system of claim 2 wherein the cooling fluid comprises an FR3 vegetable oil.

5. The system of claim 1 wherein the inlet port of the heat exchanger is in fluid communication with a first portion of the enclosure and the outlet port of the heat exchanger is in fluid communication with a second portion of the enclosure.

6. The system of claim 5 wherein the first portion of the enclosure is located above the heat density weighted average center of the discrete electrical components at the first height along the vertical direction and the second portion of the enclosure is located below the heat density weighted average center of the discrete electrical components at the first height along the vertical direction.

7. The system of claim 6 wherein a flow of the cooling fluid is established along a path from the enclosure to the heat exchanger through the inlet port of the heat exchanger and from the heat exchanger to the enclosure through the outlet port.

8. The system of claim 7 wherein an integration of a cooling fluid density multiplied by gravity along the path of the cooling fluid is positive.

9. A method of cooling a power electronics based system using natural, convection cooling, comprising:
    disposing in an enclosure, housing a plurality of discrete electrical components being distributed in a vertical direction from a bottom portion to a top portion of the enclosure and having a heat density weighted average center at a first height along the vertical direction;
    disposing a heat exchanger adjacent to and external of the enclosure, the heat exchanger including an inlet port in fluid communication with the enclosure and an outlet port in fluid communication with the enclosure, the heat exchanger having a vertical cooling center at a second height along the vertical direction; and
    providing a cooling fluid disposed in the enclosure and in the heat exchanger to cool the discrete electrical components, the discrete electrical components immersed in the cooling fluid;
    wherein the discrete electrical components are positioned in the vertical direction in the enclosure such that the first height of the heat density weighted average center along the vertical direction is below the second height of the vertical cooling average center of the heat exchanger in order to sustain flow of the cooling fluid between the enclosure and the heat exchanger through natural convection; and
    wherein the discrete electrical components include a plurality of capacitors, a plurality of inductors, and a plurality of semiconductor switches, and wherein the method includes positioning the plurality of capacitors at a height along the vertical direction which is greater than a height along the vertical direction of the plurality of inductors and the plurality of semiconductor switches.

10. The method of claim 9 wherein the cooling fluid includes dielectric properties.

11. The method of claim 10 wherein the cooling fluid comprises one of a mineral oil or a vegetable oil.

12. The method of claim 10 wherein the cooling fluid comprises an FR3 vegetable oil.

13. The method of claim 11 wherein the inlet port of the heat exchanger is in fluid communication with a first portion of the enclosure and the outlet port of the heat exchanger is in fluid communication with a second portion of the enclosure.

14. The method of claim 13 wherein the first portion of the enclosure is located above the heat density weighted average center of the discrete electrical components at the first height along the vertical direction and the second portion of the enclosure is located below the heat density weighted average center of the discrete electrical components at the first height along the vertical direction.

15. The method of claim 14 wherein a flow of the cooling fluid is established along a path from the enclosure to the heat exchanger through the inlet port of the heat exchanger and from the heat exchanger to the enclosure through the outlet port.

16. The method of claim 15 wherein an integration of a cooling fluid density multiplied by gravity along the path of the cooling fluid is positive.

* * * * *